Sept. 24, 1963 H. DITKOFSKY 3,105,159

PULSE CIRCUITS

Filed Aug. 16, 1961

INVENTOR.
HARRY DITKOFSKY
BY John V. Regan
Attorney

United States Patent Office 3,105,159

Patented Sept. 24, 1963

3,105,159

PULSE CIRCUITS

Harry Ditkofsky, Haddonfield, N.J., assignor to Radio Corporation of America, a corporation of Delaware Filed Aug. 16, 1961, Ser. No. 131,754

14 Claims. (Cl. 307—88.5)

This invention relates in general to transistor pulse circuits and, more particularly, to improved transistor pulse circuits which have reduced turn-on and turn-off times.

The transient response, turn-on delay, and storage time (saturation delay time) of a transistor basically determine the maximum repetition rate or speed of switching of the transistor circuit. Most known transistor pulse circuits of the type used in digital information handling systems, digital computers for example, are operated nonlinearly as large signal devices, the applied signals being of sufficient amplitude to drive the transistor from cutoff to saturation, or vice versa. The transistor turn-on delay is greater when the transistor is driven into heavy conduction from a cutoff state than from a condition of low conduction. Overdriving the transistor reduces this turn-on delay, but the attendant saturation results in undesirable minority carrier storage which increases the turn-off time.

It is a general object of this invention to provide improved transistor circuits which have a high switching speed.

It is another object of this invention to provide improved transistor circuits which have reduced turn-on and turn-off times.

It is still another object of this invention to provide improved transistor circuits, including means for controlling the degree of transistor saturation or for preventing saturation, as desired.

These and other objects are accomplished according to one embodiment of the invention by connecting a tunnel diode rectifier between the collector electrode of a common emitter transistor and the base end of the input coupling impedance. The tunnel rectifier device is poled so that the direction of easy current flow through the device is in the same direction, with respect to the collector, as the direction of forward current through the collector-base diode. When the tunnel diode rectifier is connected directly to the base, the collector voltage is clamped substantially at, for example, to within a tenth of a volt of its saturation value by the low voltage drop across the tunnel rectifier. Saturation may be further reduced or prevented by connecting an impedance of suitable value in the base input circuit. Turn-off delay may be reduced by connecting an inductor in series with the tunnel rectifier to provide reverse base current.

In the accompanying drawing, like reference characters refer to like components, and:

Figure 1:
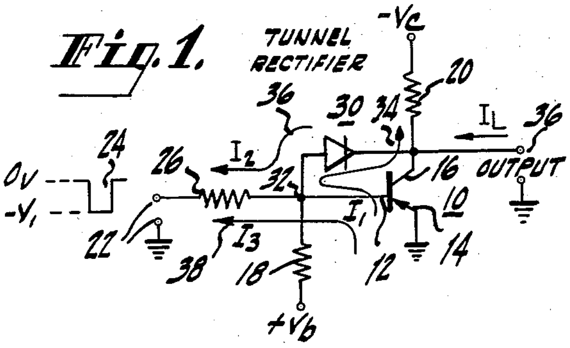
FIGURE 1 is a schematic diagram of one form of high speed pulse circuit according to the invention.

Transistor pulse type circuits commonly are characterized by large signal, or nonlinear, operation of the transistor in which the transistor is driven between cutoff and saturation in response to input signals which vary between first and second levels. The output pulse from such a transistor circuit usually is distorted with respect to the input pulse because the transistor cannot respond instantaneously to a change in signal level. There may be a delay between the time the input signal is applied and the time that a change of current is produced in the transistor. The term "turn-on" is used here to include the rise time and the delay aforementioned, and may be defined as the time it takes the output pulse to reach 90 percent of its maximum value referenced from the time of application of an input pulse tending to increase transistor conduction. The turn-on time is determined in part by energy storage effects resulting from transistor saturation, in part by the amount of transistor conduction when the input pulse is applied, and by other factors. In general, turn-on time may be reduced by operating the transistor in a condition of low conduction, as opposed to cutoff, in the absence of an input drive pulse.

Turn-on time also may be reduced by overdriving the transistor. However, undesirable effects are produced when the transistor is driven into saturation. In particular, the output current does not fall immediately from its high value when the input drive pulse is terminated, but remains almost at its maximum value for a period of time. This period is called the storage time, or turn-off delay, and results from injected minority carriers present in the base region of the transistor. Saturation of the transistor has the effect of pulse widening and reduction in the maximum repetition rate at which the circuit can be operated. It also may affect adversely the transistor rise time. The term "turn-off time" is used here to denote the sum of the storage time, or turn-off delay, and the fall time: the term "transient response" is used to denote the response of the transistor during rise and fall time. In general, fall time may be reduced through the application of a reverse base current at the termination of the input drive pulse.

Transistor turn-on and turn-off times determine the switching speed capabilities of a transistor circuit. It will be apparent from the above discussion that the switching speed may be increased by reducing any of the turn-on delay, rise time, storage time, and fall time, and particularly the storage time. The duration of storage time is essentially governed by the degree of saturation into which the transistor is driven and the time spent in saturation, and may be reduced by limiting the degree of saturation to a low value or avoided by preventing saturation of the transistor.

The above and other characteristics of nonlinear transistor operation are described in greater detail at pages 188–194 of the Technical Manual No. 11–690, entitled "Basic Theory and Applictaion of Transistors," published by the Department of the Army.

The turn-on and turn-off times of a transistor circuit are reduced according to the invention by driving the transistor between a low conducting condition and a high conducting condition in which the transistor is either unsaturated, or in which saturation is controlled in limited to a low value. The corresponding low and high output voltage levels are established, and saturation is controlled or prevented, as desired, by a tunnel diode rectifier, that is a backward diode, connected between the input and output electrodes of the transistor. The tunnel diode rectifier serves as a clamp for both the low and high output levels, and obviates the need for a conventional clamping diode and clamp voltage at the output.

FIGURE 1 is a schematic diagram of one form of the invention. The pulse circuit comprises a PNP transistor 10 having base 12, emitter 14, and collector 16 electrodes.

The transistor 10 is connected in the common emitter configuration by connecting the emitter electrode 14 directly to a point of reference potential, indicated in the drawing by the conventional symbol for circuit ground. The collector electrode 16 is biased in the reverse direction with respect to the base electrode 12 by connecting the collector electrode 16 through a resistor 20 to a source of biasing potential, designated $-V_c$. The bias source $-V_c$ may be a battery (not shown) having its negative terminal connected to the upper end of the resistor 20 and having its positive terminal connected to ground. A resistor 18 is connected from the base 12 to a source of positive bias potential $V_b$, which may be a battery (not shown).

A pair of input terminals 22 are provided for receiving input pulses 24 for controlling the operating state of the transistor circuit. One of the terminals 22 is connected to ground, and the other of the terminals 22 is connected through a coupling resistor 26 to the base electrode 12. A tunnel diode rectifier, or backward diode, 30 is connected between the collector electrode 16 and a junction joint 32 common to the base electrode 12 and the resistor 26. Tunnel diode rectifiers, their characteristics and operation are described in an article at pages 9–31 of the 1959 "IRE Wescon Convention Record," Part III on Electron Devices, and in other publications. Accordingly, only those characteristics of the device which are necessary to an understanding of the present invention will be described here.

Figure 2:
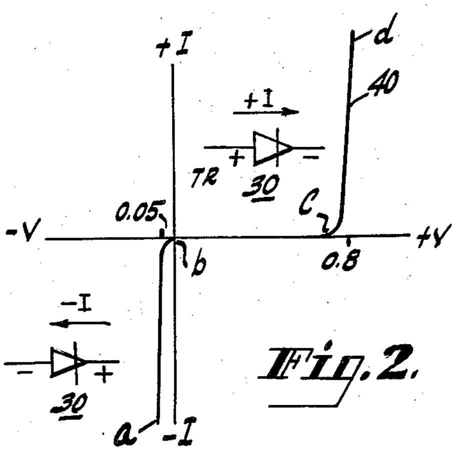
FIGURE 2 is a volt-ampere characteristic of a tunnel diode rectifier, or backward diode.

A tunnel diode rectifier, also known as a backward diode, may be considered to be a modified tunnel diode which has a volt-ampere characteristic of the general type illustrated in FIGURE 2. In FIGURE 2, voltage is plotted along the abscissa, and current is plotted along the ordinate. The volt-ampere characteristic 40 has a first portion *ab* in which substantial current flows through the rectifier in response to a voltage of approximately 0.05 volt in a first polarity direction across the device. The symbol used for the tunnel rectifier 30 and the relative polarities at the rectifier 30 terminals for this current condition are illustrated in the third quadrant of the FIGURE 2 characteristic. The current $-I_1$ may be said to flow through the rectifier 30 in the easy current flow direction, that is to say, in the low impedance direction of the rectifier 30. The portion *ab* of the characteristic 40 is substantially parallel to the ordinate, whereby the voltage across the rectifier 30 is substantially constant over a wide range of rectifier currents. In actual practice, the voltage across the rectifier 30 in the region *ab* varies over a small range as the current is increased from a low value to a very high value, but this range of voltages may be neglected for practical purposes.

The characteristic 40 has a second region *bc* in which the current is zero as the voltage across the rectifier is varied from zero volts to approximately 0.8 volt in the opposite polarity direction. The symbol for the rectifier 30 and the relative polarities at the rectifier 30 terminals during the portion *bc* of the characteristic 40 are illustrated in the first quadrant. The characteristic 30 has a third portion *cd* in which the current through the rectifier 30 is variable over a wide range at approximately the same voltage. The particular voltage values given in FIGURE 2 are for one type of gallium arsenide device.

Consider now the operation of the FIGURE 1 circuit. The input pulses 24 have either a first value of zero volts or a second value of $-V_1$ volts. The transistor 10 would be nonconducting in response to the zero volt input level in the absence of the tunnel rectifier 30. However, the rectifier 30 device can pass current in either direction under proper conditions of voltage differential across its terminals. In this case, the voltage at the input terminal 22 at the left terminal of the rectifier 30 is zero volts. The right-hand terminal of the tunnel rectifier, however, is connected to the $-V_c$ bias source through the collector load resistor 20. The rectifier 30 then is biased for operation along the portion *cd* of the volt-ampere characteristic 40, and a voltage of approximately 0.8 volt is maintained across the terminals of the rectifier 30. The values of the biasing sources $V_c$ and $V_b$ and the values of the resistors 20 and 18 are selected so that the voltage at the base 12 is negative with respect to the emitter 14 when the input is at zero volts. Accordingly, the emitter-base diode is forward biased and a current $I_1$ in the conventional sense, flows through the emitter-base diode of the transistor 10, the rectifier 30, and the collector resistor 20 to the bias supply. This base current, indicated by the arrow 34, is in a direction to turn the transistor 10 on, and the current flows in the emitter-collector path of the transistor 10. The latter current causes the voltage at the collector 16 to rise in a positive direction and has a value of $\beta I_1$, where $I_1$ is the base current supplied through the tunnel rectifier and $\beta$ is the beta of the transistor.

The base current $I_1$ automatically adjusts to a level at which the total current flowing through the collector resistor 20, including the base current $I_1$, the collector current $\beta I_1$, and the load current $I_L$, if any, from the output terminals 36, causes the collector 16 voltage to have a value equal to the voltage drop across the tunnel rectifier 30 and the emitter-base diode 10. The voltage at the collector 16 is clamped at this value by the tunnel rectifier regardless of changes in the loading at the output terminals 36, obviating the need for a separate clamp diode and clamp voltage. Changes in the output load are compensated for automatically by a change in the base 12 current supplied through the tunnel rectifier 30.

Current flow from the upper input terminal 22 and through the input resistor 26 is neglected in the above discussion. This current is assumed to be negligible in view of the small voltage differential between the common junction 32 and the upper input terminal 22, and the value of the resistor 26. Also, the base 12 bias current is neglected for convenience.

Assume now that the input voltage level drops to $-V_1$ volts, and that an input of $-V_1$ volts is sufficient to saturate the transistor 10 in the absence of the tunnel rectifier 30 circuit. An increase in base current results when the input drops to $-V_1$ volts. This base current increase causes a rapid increase in collector 16 current, because the transistor 10 already is in conduction, and the voltage at the collector 16 rises in a positive direction. The negative-going input pulse 24 causes the voltage across the tunnel rectifier 30 to decrease below 0.8 volt, and conduction through the rectifier 30 ceases momentarily as the operating point of the rectifier 30 is shifted into the region *bc* of its operating characteristic. Accordingly, the full input current is applied initially to the base electrode 12 to provide a "hard" initial drive at the base 12. Conduction through the transistor 10 increases until a point of saturation is reached. When the voltage at the collector 16 becomes 0.05 volt positive with respect to the voltage at the base 12, the rectifier 30 conducts in the opposite direction, as indicated by the arrow 36. A current $I_2$ flows through the tunnel rectifier 30 to the input terminal 22, and a current $I_3$ flows through the emitter-base diode to the input terminals 22. The direction of the latter current is indicated by the arrow 38. The tunnel rectifier 30 then is operating along the portion *ab* of its characteristic curve 40. The rectifier 30 serves as a clamp to prevent the collector 16 from going more than 0.05 volt positive with respect to the base 12, and limits transistor 10 saturation to a relatively low value. Storage delay time at this value of saturation is short compared to the storage delay time occasioned by full transistor saturation. The excess current provided by the negative-going input pulse 24 essentially is diverted away from the base 12 through the tunnel rectifier 30.

It is thus seen that the rectifier 30 performs several important functions in the FIGURE 1 circuit. In addition to clamping the collector 16 voltage at a predetermined value in the full "on" condition of the transistor 10, the rectifier 30 also serves to clamp the collector 16 voltage in the low conducting condition of the transistor 10. The rectifier 30 also limits the degree of saturation of the transistor 10 to a low value, the collector 16 being held approximately 0.05 volt positive with respect to the base 12. Further, the rectifier 30 maintains the transistor 10 in a condition of low conduction, relatively speaking, in the absence of a negative input pulse 24. The turn-on and turn-off times are thereby reduced by shortening the storage time and by allowing the transistor to be driven into heavy conduction from a low conducting state. The turn-off time also is shortened because the tunnel diode rectifier 30 current initially flows to the base 12 as reverse base current when the negative input pulse 24 is terminated. The base 12 biasing circuit comprising resistor 18 and bias source $V_b$ also aids in reducing the turn-off time by providing short duration reverse base current when the input pulse 24 is terminated.

In the high conducting state of the transistor, the tunnel diode rectifier 30 provides a substantial improvement over a similar circuit in which an ordinary diode is used in the feedback path. A conventional diode does not begin conducting effectively until the collector 16 voltage becomes approximately 0.3 volt positive with respect to the base 12. The transistor 10 then is well into saturation, and the storage time is greatly increased over the FIGURE 1 circuit. Moreover, a conventional diode does not conduct in the reverse direction at the voltages normally employed in a transistor pulse circuit of the type described. Accordingly, a conventional diode could not provide base current for maintaining the transistor 10 in a low conducting state in the absence of the negative-going input signal 24. Transistor turn-on time is longer than that required for the FIGURE 1 circuit since the transistor 10 then has to be turned on from a nonconducting condition. Additionally, the conventional diode cannot clamp the collector 16 voltage in the "off" state of the transistor 10, and a separate clamping diode and clamping voltage would be required.

Figures 3, 4:
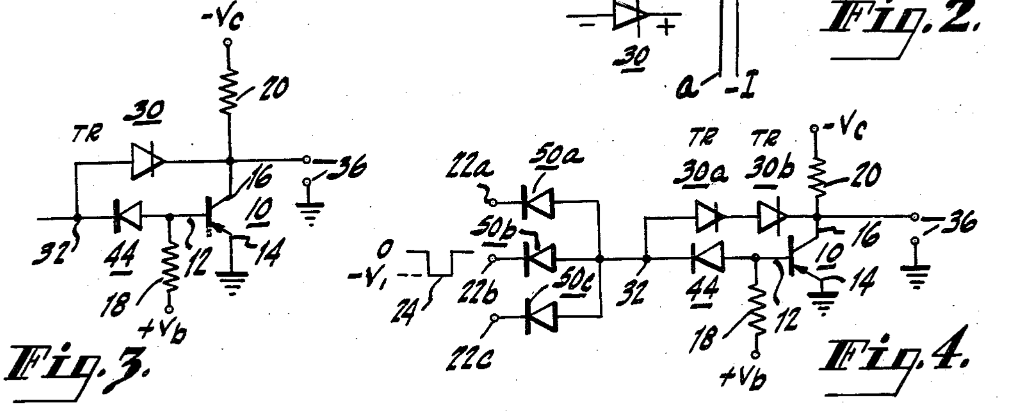
FIGURE 3 is a schematic diagram of another form of the invention including means for preventing transistor saturation.
FIGURE 4 is a modification of the FIGURE 3 circuit.

The degree of saturation can be further reduced, or eliminated entirely, as desired, by connecting a suitable impedance element between the common junction point 32 and the base electrode 12, as illustrated in FIGURE 3. The impedance element may be, for example, a germanium diode 44 connected to pass forward base current in the easy current flow direction of diode 44. The forward voltage drop across the diode 44 is approximately 0.3 volt, depending upon the type of diode. Saturation is prevented in the FIGURE 3 circuit inasmuch as the 0.3 volt drop across the diode 44 is greater than the 0.05 volt drop across the tunnel diode rectifier 30. The base electrode 12 then is always at least 0.25 volt more positive than the collector 16 voltage in response to a negative input pulse 24. Operation of the FIGURE 3 circuit is otherwise similar to that of the FIGURE 1 circuit and need not be described in further detail.

Suffice it to say that the tunnel diode rectifier 30 operating point is along the region *cd* of the characteristic curve 40 (FIGURE 2) when the input to the circuit is zero volts. Forward base current flows through the emitter-base diode, the conventional diode 44, the tunnel diode rectifier 30 and the collector resistor 20 to the $-V_c$ bias source, and maintains the transistor 10 in a condition of low conduction when the input is zero volts. The tunnel diode rectifier 30 serves as a clamp in the low conducting condition, the clamping voltage being the sum of the voltage drops across the tunnel diode rectifier 30, the conventional diode 44 and the emitter-base diode of the transistor 10. The clamping voltage is approximately 0.3 volt higher in the FIGURE 3 circuit than in the FIGURE 1 circuit by virtue of the forward drop across the conventional diode 44.

The impedance element 44 also may be another tunnel rectifier, a gallium arsenide tunnel rectifier for example, poled to operate along the region *ab* of its volt-ampere curve when passing forward base 12 current. The collector 16 and base 12 voltages then are held at approximately the same potential when the transistor 10 is in heavy conduction. Alternatively, one or more germanium tunnel rectifiers may be connected in series with the base 12. A germanium tunnel rectifier, volt-ampere characteristic has the same general shape as the charasteristic 40; the operating voltages are smaller, however. A single germanium tunnel rectifier could be used as the impedance element 44 with the rectifier poled to operate along the region *cd* of its characteristic when passing forward base current. The drop across the germanium tunnel rectifier would be about 0.3–0.4 volt, whereby the collector 16 voltage would always be 0.25–0.35 volt negative with respect to the base 12 when the transistor conducted heavily. If two germanium tunnel rectifiers were connected in series with the base 12, each of the rectifiers preferably would be poled to operate along the portion *ab* of its characteristic. The sum of the voltage drops across these rectifiers would be slightly greater than 0.5 volt, whereby the transistor 10 would be prevented from saturating.

The tunnel diode rectifier 30 has a further advantage as a clamp in that several of these devices may be connected in series to establish a desired clamping potential without affecting its ability to prevent or limit saturation to a low value, especially when an impedance element is connected between the base electrode 12 of the transistor 10 and the common junction 32. Consider, for example, the pulse circuit illustrated in FIGURE 4 in which two tunnel diode rectifiers 30*a*, 30*b* are connected in series between the collector electrode 16 and the common junction point 32. The impedance element 44, illustrated as a conventional diode, is connected between the junction point 32 and the base electrode 12 and is poled in a direction to pass forward base currents. A resistor 18 is connected from the base electrode 12 to a source of positive biasing potential $V_b$. Three conventional diodes 50*a* . . . 50*c* serve as input impedances to the transistor circuit and have their anodes connected together and to the common junction point 32. Input signal pulses, such as the pulse 24, are applied individually to the cathodes of the diodes 50*a* . . . 50*c* from separate sources (not shown). These input pulses vary between 0 and $-V_1$ volts.

Figures 5, 6, 7:
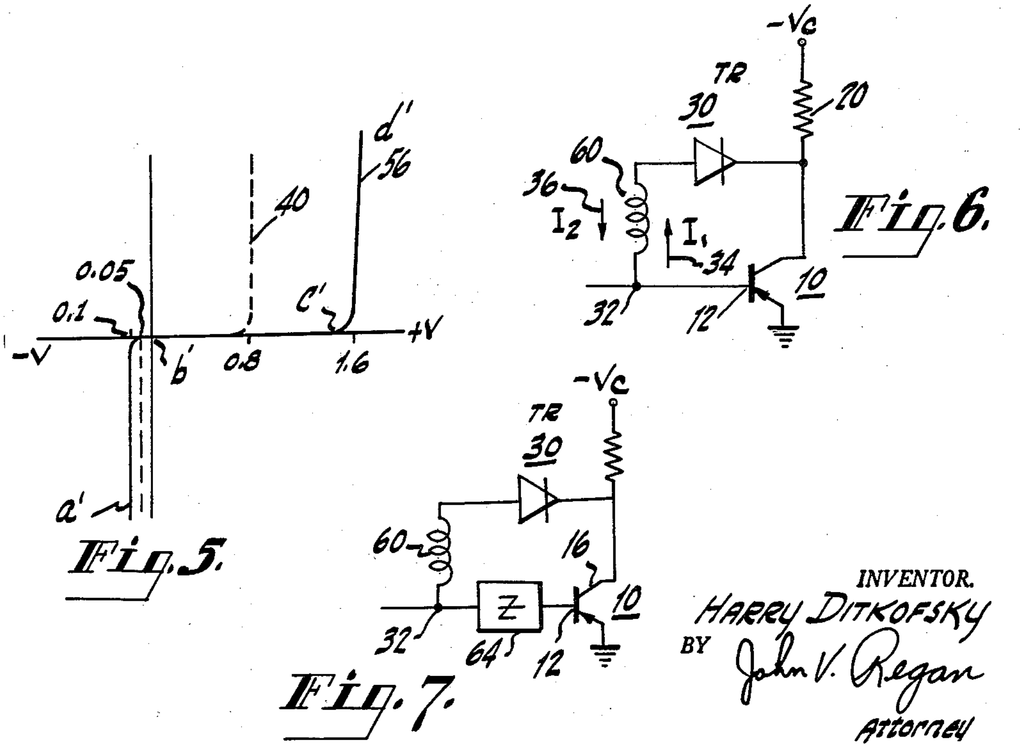
FIGURE 5 is a combined volt-ampere characteristic of a pair of like tunnel diode rectifiers.
FIGURE 6 is a schematic diagram of a controlled saturation circuit including means for providing additional turn-on and turn-off drive.
FIGURE 7 is a schematic diagram of the FIGURE 6 circuit modified.

In the absence of the tunnel rectifier 30*a*, 30*b* circuit, the transistor 10 would be nonconducting when the inputs at all of the input terminals 22*a* . . . 22*c* are zero volts. In the FIGURE 4 circuit, however, the tunnel rectifiers 30*a*, 30*b* conduct when the inputs are all at zero volts, and the operating point of each of the rectifiers 30*a*, 30*b* is along the portion *cd* of its operating characteristic 40. The combined volt-ampere characteristic for the two series rectifiers 30*a*, 30*b* is illustrated by the solid curve 56 in FIGURE 5. These tunnel rectifiers 30*a*, 30*b* are assumed to be identical, and the combined characteristic 56 is derived by adding the voltages across the rectifiers 30*a*, 30*b* at the same values of current. The characteristic curve 40 of a single tunnel rectifier 30*a* or 30*b* is indicated in FIGURE 5 by the dashed curve 40. It may be seen from FIGURE 5 that the combined characteristic 56 has substantially the same shape as the single characteristic 40, but that the voltages across the series combination in the active regions of the pair are twice the voltages of a single tunnel rectifier 30*a* or 30*b*. Specifically, the voltage across the pair is approximately 1.6 volts when the inputs at the terminals 22*a* . . . 22*c* are at zero volts. The voltage across the pair is approximately 0.1 volt when any of the inputs is at $-V_1$ volts, assuming that the tunnel rectifiers 30*a* and 30*b* are gallium arsenide tunnel rectifiers.

The tunnel rectifiers 30*a* and 30*b* supply forward base current for the transistor 10 when all of the inputs are at zero volts. This current flows, in the conventional sense, through the emitter-base diode of the transistor 10, the conventional diode 44, the tunnel rectifiers 30*a*, 30*b* and the resistor 20 to the biasing source $-V_c$. Current also flows from the voltage source $+V_b$ through the resistor 18, the conventional diode 44 and the tunnel rectifiers 30*a* and 30*b*. The values of the bias sources $-V_c$ and $+V_b$, and the values of the resistors 20 and 18 are selected so that the voltage at the base electrode 12 is negative with respect to the emitter electrode 14 when all of the inputs are at zero volts. Accordingly, the transistor 10 conducts in the absence of a negative-going input pulse 24 and allows a faster turn-on of the transistor 10 than would normally be achieved if the transistor 10 were turned on from a nonconducting condition. Additionally, the tunnel rectifiers 30*a* and 30*b* serve as a clamp for the output voltage at the collector 16. The clamp voltage is the sum of the voltage drops across the tunnel rectifiers 30*a*, 30*b*, the conventional diode 44 and the emitter-base diode of the transistor 10. The addition of the extra tunnel rectifier 30*b* has the effect of increasing the clamping voltage by an amount equal to approximately 0.8 volt, the drop across the rectifier 30*b*.

The sum of the voltage drops across the tunnel rectifiers 30*a*, 30*b* when current flows through these rectifiers in the opposite direction is approximately 0.1 volt, a value less than the forward drop across the conventional diode 44. Accordingly, the transistor 10 is prevented from saturating in response to a negative-going input pulse 24. That is to say, the voltage at the collector 16 is prevented from going more positive than the voltage at the base 12 because the voltage drop across the conventional diode 44 is greater than the voltage drop across the tunnel rectifiers 30*a*, 30*b* in combination. The tunnel rectifiers 30*a*, 30*b* also serve as a clamp for the collector 16 voltage when the transistor 10 is in heavy conduction. The base 12 biasing circuit comprising the resistor 18 and biasing source $+V_b$ provides short duration reverse base current for the transistor 10 when the negative input pulse 24, or pulses, is terminated, that is while the operating point of the tunnel rectifiers 30*a* and 30*b* is shifting from the region *a'b'* to the region *c'd'* of the combined operating characteristic 56. It is believed apparent from the discussion of the FIGURE 3 circuit that one or more tunnel rectifiers may be used as the impedance element 44 in FIGURE 4.

Transistor fall time may be further reduced in some cases by connecting an inductor 60 in series with the tunnel diode rectifier 30, or rectifiers, as illustrated in FIGURE 6. In FIGURE 6, the arrow 34 indicates the direction, in the conventional sense, of current flow through the tunnel rectifier 30 when the input is at 0 volts, and corresponds to the arrow 34 of FIGURE 1. The arrow 36 indicates the direction, in the conventional sense, of current flow in the tunnel rectifier 30 circuit when the transistor 10 is in heavy conduction, in response to a negative input pulse. Current through an inductor, as is known, cannot be changed instantaneously. Accordingly, when the input is changed from zero volts to $-V_1$ volts, the current $I_1$ is not immediately reduced to zero, but continues to flow for a short period during which the inductor 60 gives up its energy. The inductor 60 has the effect of providing a "harder" initial drive for the transistor 10 since the current $I_1$ during the short period aforementioned is in a direction to aid the negative-going input pulse of current. The tunnel rectifier 30 also provides control of the degree of saturation in the same manner as in the FIGURE 1 circuit when a large negative current pulse is applied at the input.

Current through the tunnel rectifier 30 reverses direction after the initial transient following application of a negative input pulse and then has the direction indicated by the arrow 36. The current $I_2$ through the inductor 60 does not immediately fall to a low value when the negative input pulse 24 is terminated, but rather remains at a high level for a short period of time due to the action of the inductor. This current is diverted to the base 12 of the transistor 10 as reverse base current and enhances transistor 10 turn-off. The tunnel rectifier 30 also provides all of the advantages of the tunnel rectifier 30 in the FIGURE 1 circuit.

FIGURE 7 illustrates a circuit which is similar in most respects to the circuit of FIGURE 6. The degree of saturation of the FIGURE 7 circuit is further reduced by connecting an impedance element 64 between the base electrode 12 and the common junction point 32. This impedance element 64 is one which can pass current in both directions and may be, for example, a tunnel diode rectifier or a resistor. Operation of the FIGURE 7 circuit is the same as the operation of the FIGURE 6 circuit, the primary differences being that the degree of transistor saturation is less and the level at which the collector 16 voltage is clamped by the tunnel rectifier 30 is higher (more negative) in the FIGURE 7 circuit. Saturation is prevented when the element 64 is one which has a greater voltage drop across it than the drop across the rectifier 30 in the region *ab* of the operating characteristic 40.

The advantages of the various circuits described above which include one or more tunnel diode rectifiers connected between the collector and base electrodes may be summarized as follows. The tunnel rectifier, or rectifiers, provides means for either controlling the degree of saturation of the transistor, or for preventing saturation of the transistor, depending upon the parameters of the base input circuit. Transistor storage time is thereby reduced to a low value, as compared to most transistor pulse circuits of the prior art. The tunnel rectifier also provides base current for the transistor in the absence of a negative-going input pulse, thereby maintaining the transistor in a state of low conduction, relatively speaking, whereby the transistor may be turned on faster than in the case where the transistor is nonconducting in one state. The tunnel rectifier also serves the function of clamping the output voltage at the collector when the transistor is in the low conducting condition, obviating the need for a separate clamp diode and clamp voltage source. The tunnel diode rectifier also serves as a clamp in the high conducting condition of the transistor. In certain cases, the tunnel rectifier circuit provides initial reverse base current to the transistor when the driving pulse is terminated and provides additional, initial forward current to the base when the drive pulse is applied. These features and advantages are provided according to the invention by a reduced number of components compared to prior art circuits having one or more of these operating features.

Although the various circuits have been described and illustrated as comprising PNP transistors, it will be understood that NPN transistors also may be employed in these new and improved pulse circuits by reversing the connections to the tunnel rectifiers and conventional diodes and by reversing the polarities of the various biasing sources and input pulses.

What is claimed is:

1. A circuit comprising: a transistor having a base, an emitter and a collector; means for applying operating potential between said emitter and said collector; and a tunnel rectifier connected between said base and said collector and poled to pass current in the direction of easy current flow when the voltage at said base has a polarity and magnitude tending to drive said transistor into saturation.

2. A circuit comprising: a transistor having a base, an emitter and a collector defining an emitter-base diode and a collector-base diode; means for applying an operating potential between said collector and said emitter; and a tunnel rectifier connected between said base and said collector and having a direction of easy current flow, said rectifier being poled so that said direction of easy current flow through said rectifier is in the same direction, with respect to said collector, as the direction of forward current flow through said collector-base diode.

3. A circuit comprising: a transistor having a base, an emitter and a collector; an input terminal for receiving input signals; impedance means connecting said input terminal to said base; a tunnel diode rectifier connected between said base and said collector and poled to conduct current in the direction of easy current flow in response to input signals applied between said input terminal and said emitter and having a polarity and magnitude tending to drive said transistor into saturation; and means for applying an operating potential between said emitter and said collector having a value to bias said tunnel diode rectifier for conduction in a direction opposite said easy current direction in response to input signals having a polarity and magnitude tending to cut off said transistor.

4. A circuit comprising: a transistor having an input electrode, an output electrode and a common electrode; means for applying an operating potential between said output electrode and said common electrode; an input terminal for receiving input signals; means connecting said input terminal to said input electrode; and a tunnel rectifier connected between said input electrode and said output electrode and poled to conduct current in the direction of easy current flow in response to input signals applied between said input terminal and said common electrode and having a polarity and magnitude tending to drive said transistor into saturation.

5. A circuit comprising: a transistor having a base, an emitter and a collector; an input terminal for receiving input signals; an impedance element having one terminal connected to said input terminal and having its other terminal connected to said base; and a circuit path including a tunnel rectifier connected between said one terminal and said collector and poled to be biased in the direction of easy current flow by input signals applied between said input terminal and said emitter and having a polarity and magnitude tending to drive said transistor into saturation.

6. A circuit as claimed in claim 5, said circuit path further including an inductance element connected in series with said tunnel rectifier.

7. The circuit as claimed in claim 5 wherein said impedance element has a value of impedance such that the voltage drop across said element in response to said input signals tending to drive said transistor into saturation is greater than the voltage drop across said tunnel rectifier when current flows through said rectifier in said easy current direction.

8. The circuit as claimed in claim 7 wherein said impedance element is a diode poled to pass forward base current in the forward direction of that diode.

9. A circuit as claimed in claim 8, said circuit path further including another tunnel rectifier connected in series with said first mentioned tunnel rectifier and poled in the same direction.

10. A circuit comprising: a transistor having a base, an emitter and a collector defining an emitter-base diode and a collector-base diode; an input terminal; an impedance element having one terminal connected to said base and the other terminal connected to said input terminal; means for applying input signals between said input terminal and said emitter; and a number of tunnel rectifiers connected between said other terminal and said collector and each having a direction of easy current flow, each of said rectifiers being poled so that said direction of easy current flow through all of said rectifiers is in the same direction with respect to said collector as the direction of forward current flow through said collector-base diode, said impedance element having a value of impedance such that the voltage drop across said element in response to input signals having a magnitude and polarity tending to drive said transistor into saturation is greater than the combined voltage drop across all of said rectifiers when current flows through said rectifiers in said direction of easy current flow.

11. The circuit as claimed in claim 10 wherein said impedance element is a diode poled to pass forward base current in the easy current flow direction of that diode.

12. A circuit comprising: a transistor having an input electrode, an output electrode and a common electrode; an input terminal; means connecting said input terminal to said input electrode; and the series combination of an inductor and a diode connected between said input terminal and said output electrode, said diode having a direction of easy current flow and being poled to conduct current in the direction of easy current flow in response to signals applied between said common electrode and said input terminal having a polarity and magnitude tending to drive said transistor into saturation.

13. A circuit comprising: a transistor having a base, an emitter and a collector defining an emitter-base diode and collector-base diode; means for applying an operating potential between said collector and said emitter, an input terminal for receiving input signals; means connecting said input terminal to said base; and the series combination of an inductor and a tunnel rectifier connected between said base and said collector, said rectifier having a direction of easy current flow, said rectifier being poled so that said direction of easy current flow through said rectifier is in the same direction with respect to said collector as the direction of forward current flow through said collector-base diode.

14. A circuit comprising: a transistor having a base, an emitter, and a collector defining an emitter-base diode and a collector-base diode; an input terminal for receiving input signals; an impedance element having one terminal connected to said base and the other terminal connected to said input terminal; and the series combination of a tunnel rectifier and an inductor connected between said collector and said other terminal, said rectifier having a direction of easy current flow and being poled so that said direction of easy current flow through said rectifier is in the same direction with respect to said collector as the direction of forward current flow through said collector-base diode.

References Cited in the file of this patent

UNITED STATES PATENTS

| | | |
|---|---|---|
| 2,884,544 | Warnock | Apr. 28, 1959 |
| 2,947,880 | Anderson | Aug. 2, 1960 |
| 2,951,953 | Dearden | Sept. 6, 1960 |
| 2,990,478 | Scarbrough | June 27, 1961 |
| 3,010,031 | Baker | Nov. 21, 1961 |